(12) United States Patent
Govenius et al.

(10) Patent No.: US 11,982,700 B2
(45) Date of Patent: May 14, 2024

(54) SELF-RESETTING SINGLE FLUX-QUANTUM MICROWAVE PHOTODETECTOR

(71) Applicant: TEKNOLOGIAN TUTKIMUSKESKUS VTT OY, Espoo (FI)

(72) Inventors: Joonas Govenius, Vtt (FI); Juha Hassel, Vtt (FI)

(73) Assignee: TEKNOLOGIAN TUTKIMUSKESKUS VTT OY, Espoo (FI)

(*) Notice: Subject to any disclaimer, the term of this patent is extended or adjusted under 35 U.S.C. 154(b) by 144 days.

(21) Appl. No.: 17/796,805

(22) PCT Filed: Jan. 25, 2021

(86) PCT No.: PCT/FI2021/050046
§ 371 (c)(1),
(2) Date: Aug. 1, 2022

(87) PCT Pub. No.: WO2021/156538
PCT Pub. Date: Aug. 12, 2021

(65) Prior Publication Data
US 2023/0052753 A1    Feb. 16, 2023

(30) Foreign Application Priority Data

Feb. 4, 2020 (FI) ..................................... 20205115

(51) Int. Cl.
*G01R 29/08* (2006.01)
(52) U.S. Cl.
CPC ................. *G01R 29/0878* (2013.01)
(58) Field of Classification Search
None
See application file for complete search history.

(56) References Cited

U.S. PATENT DOCUMENTS 5,963,351 A * 10/1999 Kaplounenko ........... H03L 7/24
329/346
7,772,871 B2 * 8/2010 Herr ......................... H03K 3/38
326/4

(Continued)

FOREIGN PATENT DOCUMENTS

| JP | H11-312971 A | 11/1999 |
| JP | 2005-260364 A | 9/2005 |
| JP | 2005-328371 A | 11/2005 |

OTHER PUBLICATIONS

International Search Report and Written Opinion dated May 3, 2021 corresponding to International Patent Application No. PCT/FI2021/050046.

(Continued)

*Primary Examiner* — Jermele M Hollington
*Assistant Examiner* — Suresh K Rajaputra
(74) *Attorney, Agent, or Firm* — SQUIRE PATTON BOGGS (US) LLP

(57) ABSTRACT

The disclosure relates to a quantum detector configured to receive a microwave signal from a microwave source. The quantum detector comprises a main element formed by a main Josephson junction and a Josephson transmission line which is coupled to the main element for outputting a measurement signal. The Josephson transmission line comprises at least a first set of JTL elements and a second set of JTL elements. The capacitively shunted Josephson junction in each JTL element in the first set is weakly damped, and the JTL element in the second set are more strongly damped than the JTL elements in the first set.

3 Claims, 4 Drawing Sheets

(56) References Cited

U.S. PATENT DOCUMENTS

| | | | |
|---|---|---|---|
| 8,571,614 B1* | 10/2013 | Mukhanov | H10N 60/10 29/829 |
| 2003/0058026 A1* | 3/2003 | Johnson | G11C 19/32 327/367 |
| 2016/0191060 A1 | 6/2016 | McDermott, III et al. | |
| 2018/0188107 A1 | 7/2018 | Zen et al. | |

OTHER PUBLICATIONS

Finnish Search Report dated Sep. 30, 2020 corresponding to Finnish Patent Application No. 20205115.

Y.-F. Chen et al., "Microwave Photon Counter Based on Josephson Junctions," Physical Review Letters, PRL 107, 217401 (2011), Nov. 18, 2011.

* cited by examiner

SELF-RESETTING SINGLE FLUX-QUANTUM MICROWAVE PHOTODETECTOR

FIELD OF THE DISCLOSURE

The present disclosure relates to direct measurement of electromagnetic energy at low temperatures, and more particularly to superconducting SFQ (single flux-quantum) microwave detectors.

BACKGROUND OF THE DISCLOSURE

Quantum computers have the potential to address computational tasks that are intractable on classical computers. In contrast to classical computation, which relies on binary data stored as definite on/off states in transistors, quantum computation utilizes qubits, two-state quantum-mechanical systems which can be in a coherent superposition of both states simultaneously.

Quantum-mechanical systems are very sensitive to the external environment. Superconducting qubits in particular need to be carefully shielded from external disturbances and operated at millikelvin temperatures. The state of a qubit can be reliably set, preserved and read only when the surrounding electric circuits dissipate very little energy in the vicinity of the qubit.

A qubit may be coupled to a microwave resonance cavity for information transfer and storage. The resonance frequency of this electrical resonator can be made dependent on the quantum state of the qubit. In such a dispersive readout scheme, the state of the qubit can then be read by sending an excitation signal to the resonance cavity, for example a few photons with a frequency close to said resonance frequency. If the frequency of these photons is selected suitably, they will resonate in the resonance cavity if the qubit is in state 1, and not resonate if the qubit is in state 0.

The microwave radiation in the resonance cavity then contains the qubit state information. The qubit state can therefore be read when this microwave source is connected to a microwave detector, which can be either directly coupled to the resonance cavity or can monitor the radiation that leaks out of the resonance cavity into a transmission line.

To avoid disturbing other qubits during the readout, the excitation amplitude of the resonance cavity must be limited to a small number of photons. Consequently, the microwave detector which measures photons that exist in or exit the resonance cavity must have very high resolution. It must be capable of producing an output signal when a given (small) threshold is exceeded in the number of photons that exit the resonance cavity. Presently, the common method at microwave frequencies is to use linear amplifiers that amplify, and thereby effectively measure, the amplitude and phase of the electric field oscillations associated with the radiation. Alternatively, a photodetector can be used to measure the number of photons. Here we refer to such detectors as quantum detectors, as they directly measure the quanta of energy stored in the electromagnetic field.

Single-photon detectors (or detectors with very low threshold number) are well known for optical photons. In recent years, circuit quantum electrodynamic (cQED) detectors, operating in the range of a few GHz, have been developed for single-photon microwave detection.

The article Chen et al., Phys. Rev. Letters 107, 217401 (2011), describes a single-photon detector suitable for measuring microwave photons with GHz frequencies. The detector utilizes a Josephson junction made of superconducting materials. This junction may be resistively and capacitively shunted to a varying degree.

Such a single-photon detector (which may also be called a Josephson photomultiplier) may be formed by connecting a Josephson junction 14 in parallel with a resistor 17 and a capacitor 18, as FIG. 1 illustrates. Together they form an electric oscillator. When the properties of the junction, the resistor and the capacitor are suitably selected, and when a suitable DC bias current is driven through the electric oscillator, the resonance frequency of the oscillator can be set to a suitable value in the GHz range. In particular, by setting the resonance frequency of the oscillator equal to the frequency of the microwave photons in the resonance cavity coupled to a qubit, the detector can be designed to detect said microwave photons.

FIG. 2 illustrates schematically the shape of the electrical potential across a capacitively and resistively shunted Josephson junction as a function of the phase difference $\phi$ across the same junction. The electric potential across the electric oscillator exhibit a first local minimum 21 at a first phase, a second local minimum 22 at a second phase, and a number of further local minima at greater values of phase.

In photon counting applications, the electric oscillator should transition from a first state to a second state when photons are absorbed: if the number of absorbed photons is less than a threshold number (a number which may for example be one), then the oscillator is in a first state, where it resonates around the first local minimum 21. If the number of absorbed photons is greater than the threshold number, the oscillator is switched to an intermediate state where the escape probability from the local minimum 21 is greatly increased. The electrical resonator will then very likely not resonate around 21 any longer but will instead transition to a second state to the right in FIG. 2. In other words, if a threshold condition (a certain number of photons reach the oscillator in a given time frame) is met, the resonator moves to the second state and the phase changes.

However, Josephson photomultipliers have certain limitations. The operation principle of the Josephson photomultiplier fundamentally requires an underdamped system; otherwise there would be no well-defined resonance capable of absorbing the incoming radiation with high efficiency. This implies that, in FIG. 1, either the resistivity of the resistor 17 must be zero or very small, or the capacitance of the capacitor 18 has to be very large, while also ensuring that the resonant frequency remains at the desired value in the GHz range. However, upon receiving microwave photons from a microwave source, an underdamped photomultiplier of the kind in FIG. 1 becomes latched in a finite-voltage state, where the average phase increases or decreases without limit and the photomultiplier therefore constantly dissipates power.

Let's assume that an underdamped Josephson photomultiplier initially oscillates around an arbitrarily labelled first local minimum 21. It is in the first state. When the number of microwave photons absorbed by the oscillator exceeds a certain threshold, the electrical circuit will move past the first local maximum 211 towards a higher phase difference. In an underdamped oscillator, the overall linear gradient of the potential leads to an indefinite increase of phase, i.e. never-ending shift to the right in FIG. 2, across many local minima 22, 23 . . . . This is the latched state where the detector continuously dissipates energy to the environment, until it is reset by turning off the bias current. The latched state is in this case the second state of the oscillator.

In the latched state the Josephson junction is not sensitive to absorption of new photons. The sensitivity can be restored by bringing the electric oscillator back to the first state, which may now be offset in phase by a constant value from the initial local minimum 21. But this restoration requires external logic to determine that the electric oscillator has latched, and then a significant decrease in bias current. Consequently, the reset time required for restoring an underdamped electric oscillator back to the first state after it has latched is typically very long compared to all other time scales of the oscillator, as well as the time scale of qubit operations in relevant applications.

On the other hand, if either the resistivity of the resistor 17 or the capacitance of the capacitor 18 are very small, the electric oscillator becomes overdamped. The system then no longer oscillates around local minimum 21 and the quantum mechanical energy levels of the electric oscillator are not well defined. Microwave photons are not effectively absorbed in an overdamped oscillator.

Document US20160191060 discloses a system for quantum computation which comprises a qubit circuit coupled to a resonant cavity and a controller which provides microwave radiation to the resonant cavity. The readout circuit may include a Josephson photomultiplier, and the readout circuit may be coupled to SFQ logic circuits with couplings which may include a Josephson transmission line. However, direct coupling to a conventional Josephson transmission line makes the Josephson photomultiplier overdamped and therefore inoperational.

It would be desirable to produce a quantum detector which is underdamped but not latching, where the first state and the second state correspond to identical states of the electric oscillator, except for an offset in phase, and no external logic or active circuitry is required to reset the detector so that it is ready for receiving the next incoming microwave pulse.

BRIEF DESCRIPTION OF THE DISCLOSURE

An object of the present disclosure is to provide an apparatus for alleviating the above disadvantages.

The object of the disclosure is achieved by an arrangement which is characterized by what is stated in the independent claim. The preferred embodiments of the disclosure are disclosed in the dependent claims.

The disclosure is based on the idea of coupling a main Josephson photomultiplier to a Josephson transmission line which includes a first, weakly damped ballistic part, followed by a second transitional part with stronger damping.

An advantage of the arrangement of this disclosure is that the nonlinear damping which occurs in the ballistic Josephson transmission line enables underdamped small-amplitude fluctuations near a potential minimum while providing a nonlocal energy dissipation channel for large fluctuations. This allows the oscillation of the main Josephson photomultiplier to achieve an optimal degree of damping with a reliable transition from a first resonance state to a second resonance state, but still prevents latching to a non-zero voltage state.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 2:
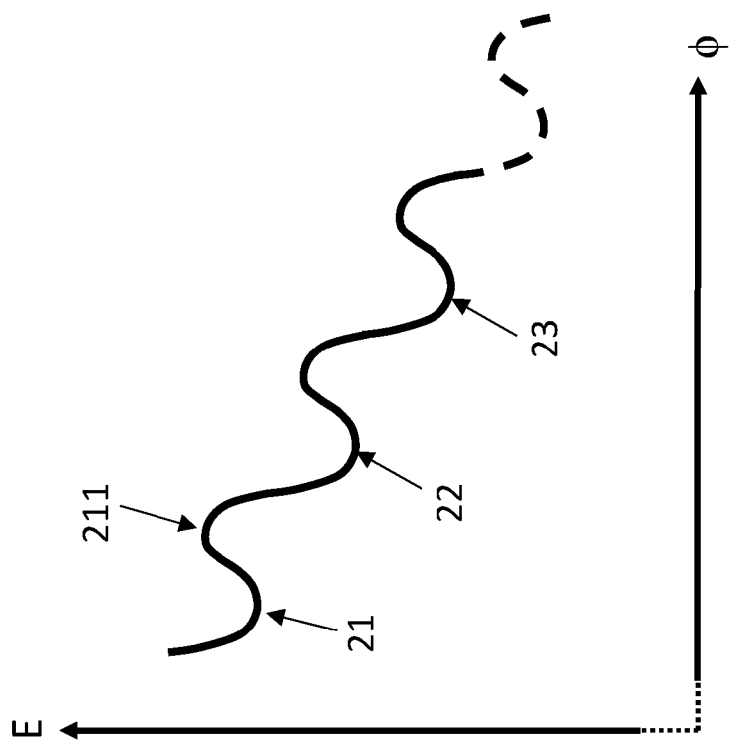
FIG. 2 illustrates schematically the shape of the electrical potential across a capacitively and resistively shunted Josephson junction.

This disclosure describes a quantum detector configured to receive a microwave signal from a microwave source through a transmission line or an antenna, or by direct coupling to a resonance cavity or other microwave source. The quantum detector comprises a main element formed by a capacitively shunted main Josephson junction which is coupled to a main bias current source. The main element is also coupled to the microwave source which inputs the microwave signal to the main element. The quantum detector also comprises a Josephson transmission line which is coupled to the main element for outputting a measurement signal.

The Josephson transmission line comprises at least a first set of JTL elements and a second set of JTL elements. The first JTL element in the first set is formed by a capacitively shunted Josephson junction coupled inductively to the main Josephson junction. All other JTL elements in the first and second sets are formed by a capacitively shunted Josephson junction coupled inductively to the Josephson junction of the neighbouring JTL element. The first and second sets of JTL elements are ordered in the Josephson transmission line so that the first set is closest to the main element. Each JTL element in the first set is weakly damped.

The JTL elements in the second set are ordered in order of increasing damping, so that the JTL element in the second set which is closest to the first set has the weakest damping, and the JTL element in the second set which is furthest away from the first set has the strongest damping, and all other JTL elements in the second set have stronger damping than the neighboring JTL element on the side of the first set, and weaker damping than the neighboring JTL element on the opposite side.

The quantum detector described in this disclosure operates in the microwave or millimeter frequency range. The quantum detector is an escape-type photodetector with self-resetting. The Josephson transmission line with multiple sets of oscillators allows the quantum detector to perform a simple self-reset and produces a measurement signal which can easily be made compatible with post-processing circuitry, for example circuitry realized with SFQ logic.

The first set of JTL elements forms a ballistic Josephson transmission line which acts as a non-linear load and enables a spontaneous reset after a detection event, as described in more detail below.

The Josephson junctions described in this disclosure may be formed from two layers of superconducting material, for example two niobium films with an aluminium oxide separation layer in between, or any other comparable arrangement known in the literature. The niobium example devices are conventionally operated at temperatures near or below 4 K, and operation is possible at the typical operating temperatures of a qubit, i.e. 5-30 mK.

The quantum detector presented in this disclosure is presented primarily as a readout component for quantum information technology. However, the same detector may also be used for example for measuring astronomical signals. The microwave source connected to the detector may in this case be an astronomy antenna. The detector may also be used in infrared imaging applications or communication applications.

The microwave source described in this disclosure may for example be a resonant cavity coupled to a qubit, or an astronomy antenna. The microwave source may be connected to the quantum detector with an input transmission line.

The Josephson transmission line may form a part of an output signal chain which transmits the measurement signal from the quantum detector to a readout circuit or post-processing circuit.

The quantum detector may be configured to output a binary measurement signal which obtains two different values. The configuration of the quantum detector for this purpose may for example involve the selection of superconducting materials with a suitable critical current, the selection of a suitable shunting capacitance for the main Josephson junction and the selection of a suitable main bias current.

With these selections, the detector can be tuned to transition from a ground state |0> to an intermediate excited state |1> when one or more photons with a given frequency reach the main element from the input transmission line. The excitation threshold may be just one photon, or it may be a comparatively small number of photons, for example on the order of a hundred. The microwave signal may at certain times comprise no photons at all, while at other times it may comprise a pulse of one or more photons with frequency matching the specific detection bandwidth. The detector may be configured to oscillate in resonance when photons within the detection bandwidth enter it.

In the intermediate excited state |1> the detector can easily transition to a different oscillation state, as described above. When this transition occurs, the released energy is rapidly transferred away from the main element by the ballistic Josephson transmission line. The ballistic Josephson transmission line transports this energy in the form of fluxons, which are the basic information-carrying entities in SFQ (single-flux-quantum) digital logic. The quantum detector can therefore be integrated with SFQ post-processing circuitry to transform or amplify the measurement output signal.

Furthermore, when the quantum detector is in the ground state |0>, waiting for a pulse of one or more photons, the ballistic Josephson transmission line formed by the first set of JTL elements allows the detector to remain in this state without significant dissipation, and hence with well-defined resonance frequencies and quantum mechanical energy levels.

Figure 1:
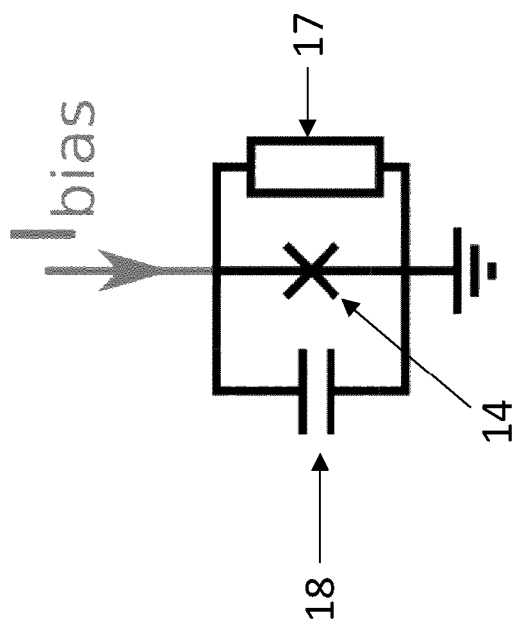
FIG. 1 illustrates a Josephson photomultiplier.

In this disclosure, the term "capacitively shunted Josephson junction" is used to refer to a Josephson junction which is shunted at least by a capacitor. The Josephson junction illustrated in FIG. 1 is shunted both capacitively and resistively, and such junctions may also be called resistively and capacitively shunted Josephson junctions (RCSJ). In some Josephson junctions described in this disclosure, there may be no intentional resistor component coupled in parallel with the junction. The resistance of the component 17 in FIG. 1 is in that case infinitely large or very large, and the junction is shunted only by the capacitor. However, in other Josephson junctions described in this disclosure, there may be a dedicated resistor component coupled in parallel with the junction, and this junction may therefore be shunted both by the capacitor and the resistor. To preserve space and to follow established convention, the shunting capacitors and resistors of Josephson junctions in the Josephson transmission line are generally not illustrated in the circuit diagrams presented in the figures of this disclosure. The presence or absence of shunting resistors, for example, is instead indicated in the corresponding text.

The damping characteristics of a single electric oscillator formed by a capacitively shunted Josephson junction can be represented numerically with the Stewart-McCumber parameter $\beta_C$ which can be defined as follows:

$$\beta_C = \frac{2e}{\hbar} I_C R^2 C$$

A quality factor Q, which compares the decay time of oscillations to the oscillation period, can correspondingly be defined as $$Q = \sqrt{\beta_C}$$

where e is the unit charge and $\hbar$ is Planck's constant, $I_C$ is the critical current of the Josephson junction, R is the resistance of a shunting resistor and C is the capacitance of a shunting capacitor.

For a single junction, the phase difference across the junction behaves analogously to the position coordinate of a massive particle in the well-known tilted washboard potential (FIG. 2), where $\beta_C$ characterizes the friction the particle experiences, the bias current driven through the junction sets the tilt of the potential, and the critical current sets the amplitude of the height of the sinusoidal modulation of the washboard potential. For a system of several junctions, the same picture applies but the potential is a function of all of the phase differences across the Josephson junctions, and thus becomes difficult to visualize for more than two junctions.

In a strongly damped junction $\beta_C$ is significantly less than one, for example 0.5 or 0.1. In a weakly damped junction $\beta_C$ is much greater than one and may preferably be as close to infinite as experimental constraints permit. However, even a junction with a $\beta_C$ value greater than 10 can be considered weakly damped in comparison to a strongly damped junction with a $\beta_C$ value less than one. In a system which comprises both strongly damped junctions and weakly damped junctions, other junctions which are damped to an intermediate degree may for example have a $\beta_C$ value which is greater than the $\beta_C$ value of any strongly damped junction in the system, and smaller than the $\beta_C$ value of any weakly damped junction in the system.

The $\beta_C$ value may for example lie between 0.5 and 100 for junctions which are damped to an intermediate degree, but these are not absolute boundaries. If the $\beta_C$ values of all weakly damped junctions in the system can be brought closer to infinity, for example above 10,000, then a junction in the same system with a $\beta_C$ value of 1,000 still exhibits an "intermediate" degree of damping. In other words, the category "intermediate" is here defined in relation to the two extreme categories "weak" and "strong". The upper limit of the range of $\beta_C$ values that can be considered "intermediate" is determined by the $\beta_C$ values that the weakly damped junctions can reach.

The parameters $I_C$, R and C can be adjusted with routine design and fabrication methods. A Josephson junction can be configured to exhibit a certain $\beta_C$-value, and a corresponding degree of damping, by these methods.

Figure 3:
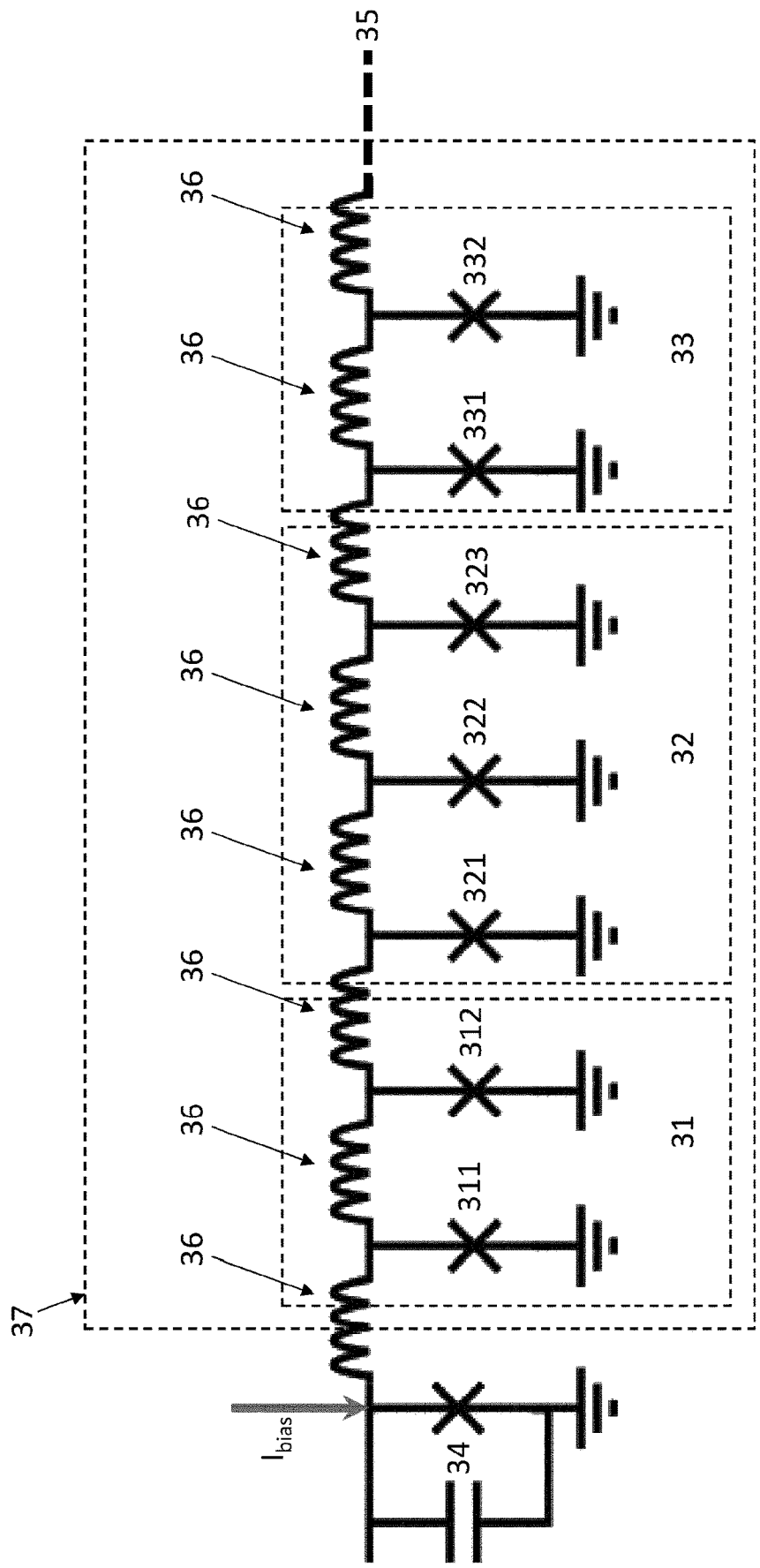
FIG. 3 illustrates a quantum detector

FIG. 3 illustrates a quantum detector according to one embodiment. The quantum detector comprises a main element 34 which comprises a main Josephson junction which is capacitively shunted by a capacitor. The main element of the quantum detector may alternatively be called a main oscillator or main electric oscillator. The quantum detector comprises a main bias current source. A main bias current $I_{bias}$ is injected by the main bias current source (the source itself is not illustrated in FIG. 3). The quantum detector also comprises a Josephson transmission line (JTL) 37. In the illustrated device, the Josephson transmission line 37 comprises a first and second set of JTL elements, indicated by reference numbers 31 and 32. At the end of the transmission line, an output signal is fed to a post-processing circuit 35. The illustrated device also comprises an optional third set of JTL elements, illustrated with reference number 33. If 33 is not present, then the second set 32 can be connected directly to the post-processing circuit 35. The left edge of FIG. 3 may be called the main element side, and the Josephson transmission line 37 may be called the output side.

Each JTL element in the first set is weakly damped, and each JTL element in the second set is more strongly damped than any of the JTL elements in the first set. The $\beta_C$ value of the junction in each JTL element in the first set may be brought as close to infinity as possible. The $\beta_C$ value of the junction in each JTL element in the second set may for example be smaller than the $\beta_C$ value of any JTL element in the first set. As explained in more detail below, the second set of JTL elements may include elements whose $\beta_C$ values differ from each other by one or more orders of magnitude. In the second set of JTL elements 32, the elements at its left end may have $\beta_C$ values of the same order of magnitude as the $\beta_C$ values in the weakly damped first set 31. Correspondingly, at the right end of the second set, $\beta_C$ values may be below one as in the third set 33 or in a standard SFQ circuit 35, for example. In between the left end and the right end of the second set, $\beta_C$ may vary smoothly, for example so that there is not more than half an order of magnitude difference between neighboring JTL elements.

The first set of JTL elements 31 forms a ballistic Josephson transmission line, or a ballistic part of the Josephson transmission line 37. It is illustrated by JTL elements 311 and 312 but may include many more JTL elements, for example between 10 and 100 elements. The second set 32, which may also be called a transitional Josephson transmission line, or a transitional part of the Josephson transmission line 37, is illustrated by JTL elements 321-323, but it may also include many more JTL elements, for example between 10 and 100. JTL element 322 has two neighboring elements in FIG. 3. JTL element 321 is the neighboring element to 322 on the side of the first set and JTL element 323 is the neighboring element to 322 on the opposite side.

The capacitively shunted main element 34 and the Josephson junctions in the JTL elements in the first set 31 are weakly damped. These oscillators may have no resistor coupled in parallel with the Josephson junction. If a resistor is coupled in parallel with these junctions, then the resistance of the resistor may be high, such that the Stewart-McCumber parameter and the quality factor will then be high, and these oscillators will be underdamped.

The system comprising the main element 34 and the weakly damped JTL elements in set 31 will have certain resonant frequencies. These frequencies are determined by the capacitances, the critical currents of the Josephson junctions, and by the injected bias currents. By selecting these parameters suitably, one of the lowest resonant frequencies can be configured to match the frequency where microwave photons are intended to be detected. If the escape rate from the excited state is matched to the coupling rate between the quantum detector and the microwave source, then resonant photons entering the main element 34 are absorbed with high efficiency.

When the quantum detector is excited from the ground state (or first state) to the excited state by one or more incoming photons, the probability is high that it will shift away from its initial oscillation equilibrium (such as 21 in FIG. 2). However, the main element will not undergo uncontrolled latching, because 37 carries away energy when one or more flux quanta are generated, thus providing nonlinear damping. The quantum detector will thereby shift to oscillations around a new equilibrium (or second state), which is equivalent to the first state except for a global shift of all of the oscillator phases by a finite number of flux quanta. The nonlinear damping in the JTL elements of the first set thereby prevents latching, i.e., continuous generation of SFQ pulses, by the main element 34.

The Josephson transmission line may further comprise a third set of JTL elements. Each JTL element in the third may be strongly damped. Each JTL element in the second set may be more weakly damped than any of the JTL elements in the third set. In other words, the Josephson junctions in the second set 32 may in this case be damped to an intermediate degree, less than those of the third set 33 but more than those of the first set 31. The $\beta_C$ value of each junction in the first set of JTL elements may be maximized as before, and the $\beta_C$ value of each junction in the third set of JTL elements may be chosen to be below one, providing a further buffer element for interfacing with standard SFQ post processing circuitry 35.

As mentioned above, the $\beta_C$ value of the leftmost junction in the second set, i.e. the junction in the second set which lies closest to the first set, may for example be set to a value which is smaller than the $\beta_C$ value of any JTL element in the first set by a suitable amount. The $\beta_C$ value of the rightmost junction in the second set, i.e. the junction in the second set which lies closest to the third set and/or to the postprocessing circuitry, may for example be set to a value which is close to 1, or slightly below 1.

The third set 33, which may also be called a traditional Josephson transmission line, or the traditional part of the Josephson transmission line 37, is illustrated by JTL elements 331-332. This third part may also be omitted from the device illustrated in FIG. 3. It may in that case be replaced by other conventional SFQ circuitry that buffer and post-process the digital output signal.

In this context, the terms "ballistic", "transitional" and "traditional" refer to the degree of damping. A ballistic part of a Josephson transmission line is weakly damped, and a traditional part is strongly damped. The transitional part exhibits intermediate damping and may include a gradual transition from weakly damped JTL elements to more and more strongly damped JTL elements.

In a practical implementation, each set 31-33 could comprise many more oscillators than have been illustrated in FIG. 3. Each set could, for example, comprise 5, 10, 20, 30, 50 or more JTL elements. The number of oscillators needed to optimize the damping and reset properties of the main element 34 depends both on the properties of the main element and on the properties of the JTL elements. Increasing the number of weakly damped JTL elements reduces the damping of small-amplitude oscillations in the first state, which is desirable for resonant photon absorption, while still providing an effective nonlinear mechanism of carrying away energy during the transition from the first state to the second state.

As mentioned before, the capacitively shunted JTL elements in the second set 32 may be damped to an intermediate degree. A shunting resistor may be coupled in parallel with the Josephson junction in these oscillators, and the shunting resistance and shunting capacitance may be configured so that the Stewart-McCumber parameter obtains a suitable intermediate value, smaller than the Stewart-McCumber parameter of any JTL element in the first set 31.

The JTL elements in the second set may be ordered in order of increasing damping, so that the JTL element in the second set which is closest to the first set has the weakest damping and the JTL element in the second set which is furthest away from the first set has the strongest damping. Every other JTL element in the second set may in this case have stronger damping than the neighboring JTL element on the main element side (i.e the side of the first set) and weaker damping than the neighboring JTL element on the output side (i.e. the side of the third set/output circuitry, which is opposite to the side of the first set).

In other words, the JTL elements of the second set 32 may be configured to provide a smooth transition between the ballistic Josephson transmission line formed by the first set 31 and the opposite end of the Josephson transmission line. As mentioned before, this opposite end may for example comprise the traditional, strongly damped Josephson transmission line formed by the third set 33 or other SFQ circuitry. Regardless of the exact choice of parameter values, the key property in 32 is that flux quanta arriving from 31 must be transmitted to the output (33/35), without reflecting or injecting any flux quanta into 31. As an example, let's say that the Stewart-McCumber parameter of JTL element 312 is 1,000, and that of JTL element 331 is 0.1. Let's imagine that the second set of JTL elements comprises 11 elements (some of which are not illustrated in FIG. 3). The Stewart-McCumber parameters of the JTL elements in the second set 32 could then for example be configured to have the following $\beta_C$ values, from left to right in FIG. 3: 500, 200, 100, 50, 20, 10, 5, 2, 1, 0.5, 0.2.

The example illustrates an arrangement where, in the second set 32 of JTL elements, the JTL element which is closest to the first set 31 has the weakest damping and the JTL element which is closest to the third set has the strongest damping. Furthermore, the rest of the JTL elements in the second set 32 are ordered (from left to right in FIG. 3) in order of increasing damping, so that each JTL element in the second set 32 has (1) a lower Stewart-McCumber parameter than the neighboring JTL element on the main element side and (2) a higher Stewart-McCumber parameter than the neighboring JTL element on the output side. The Stewart-McCumber parameters of the JTL elements in the second set could for example be configured to lie at logarithmically equal intervals or linearly equal intervals between the Stewart-McCumber parameter of the last oscillator 312 in the first set 31 and the Stewart-McCumber parameter of the first oscillator 331 in the third set 33.

It would be possible to deviate from this monotonous decrease in the Stewart-McCumber parameter from left to right in the second set of JTL elements. Continuing the example given above, where the $\beta_C$ values in the second set were from left to right: 500, 200, 100, 50, 20, 10, 5, 2, 1, 0.5 and 0.2, let's imagine that two further JTL elements are added so that the beginning of the sequence becomes 500, 200, 300, 100, 50, 20, 30, 10 . . . . The addition of the element with $\beta_C$=300 in this case simply makes the element with $\beta_C$=200 redundant, and the addition of the element with $\beta_C$=30 likewise makes the element with $\beta_C$=20 redundant. In other words, deviations from the monotonous decrease pattern illustrated above are possible, but they simply increase the number of JTL elements without providing any practical advantage.

Monotonous decrease in the Stewart-McCumber parameter throughout the entire series of interconnected JTL elements in the second set is therefore not a necessary requirement, but JTL elements which deviate from monotonous decrease will not perform any useful function and can for practical purposes be ignored. The second set of JTL elements may for this reason be defined so that it only includes JTL elements which exhibit a monotonous decrease in the Stewart-McCumber parameter. Any intervening JTL elements which deviate from this monotonous decrease can be considered additional JTL elements which do not form a part of the second set.

The capacitively shunted Josephson junctions in the JTL elements in the third set 33 are strongly damped (like all Josephson junctions in a regular Josephson transmission line where no ballistic part is present). These JTL elements typically have a resistor coupled in parallel with the Josephson junction. The Stewart-McCumber parameter and the quality factor will be low and the oscillators will be strongly damped.

In other words, by configuring the resistance, capacitance and critical current parameters of each JTL element to a suitable value, the Josephson transmission line can be configured to comprise two distinct parts and an optional third part: a ballistic JTL part 31 with low damping, a transition JTL part 32 with intermediate damping which may increase gradually from the first JTL element in 32 which lies closest to the main element side to the last JTL element in 32 which lies closest to the output side. The optional third part is a regular JTL part (which may also be called a traditional JTL part) 33 with high damping.

Figure 4:
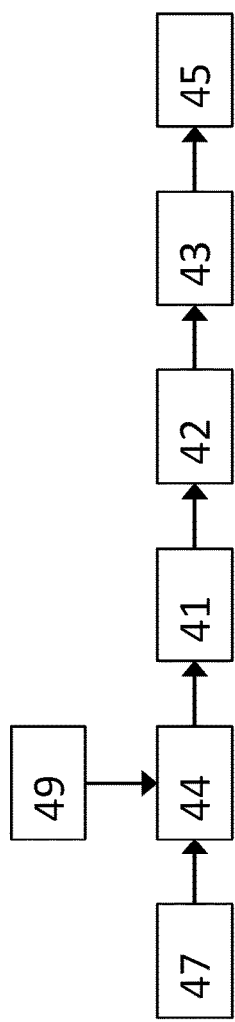
FIG. 4 illustrates schematically a measurement setup where the quantum detector may be used.

FIG. 4 illustrates schematically a measurement setup where the quantum detector may be used. Reference numbers 41-45 correspond to reference numbers 31-35, respectively, in FIG. 3. The third set 43 is optional, as before. The main bias current source 49 injects a direct current that flows primarily through the main element 44 and the first JTL elements in 31. The quantum detector may also comprise additional bias current sources, and each JTL element in the first, second and third sets 41-43 may be coupled to an additional bias current source. Each JTL element may be coupled to its own additional bias current source. Alternatively, multiple JTL elements may be coupled to one additional bias current source. The bias may be provided by a number of standard sources, including those used in standard rapid single flux-quantum (RSFQ) circuits as well as those used in different variants of energy-efficient single flux-quantum circuits (ERSFQ/eSFQ). If all Josephson junctions in the first, second and third sets of JTL elements have the same critical current $I_C$, then the bias current driven through the Josephson junctions in the first set may for example be zero, and the bias current driven through the Josephson junctions in the third set may for example be in the range 0.3 $I_C$-0.6 $I_C$. The bias current driven through the Josephson junctions in the second set may be in the range 0.01 $I_C$-0.5 $I_C$. This correlation between damping and bias current is natural because, as the Stewart-McCumber parameter decreases from 31 to 32 (and optionally through 32 and into 33), the bias currents may increase without risk of generating spurious uncontrolled pulses of flux quanta.

The main element 44 is also coupled to a microwave source 47 which inputs a microwave signal to the main element 44. This microwave source 47 may be any microwave oscillator, transmission line or antenna. Depending on the application, the detector may for example be coupled directly to a qubit, to a readout resonator coupled to a qubit, or an antenna coupled to free space. There may also be a transmission line or other standard microwave components, such as circulators, in between the detector and the microwave source.

The Josephson transmission line 41-43 produces an output signal which is fed to a post-processing circuit 45. As mentioned above, due to the three-part arrangement in the Josephson transmission line, which includes a set of ballistic JTL elements, the post-processing circuit may be an SFQ circuit, or other digital logic circuit fed through SFQ/DC converters.

Figure 5A:
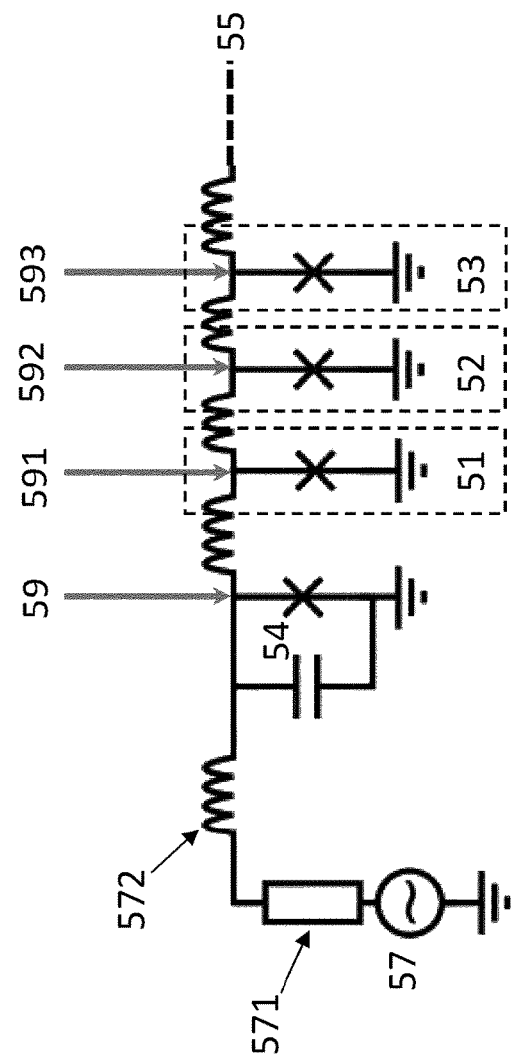
FIG. 5a illustrates the measurement setup of FIG. 4 in a circuit diagram.

FIG. 5a illustrates the measurement setup of FIG. 4 in a circuit diagram. Reference numbers 51-55, 57 and 59 correspond to reference numbers 41-45, 47 and 49 in FIG. 4. FIG. 5a illustrates optional additional bias current sources 591-593 which may be connected to the JTL elements in the manner described above. The microwave source 57, with a certain characteristic or output impedance represented by 571, may be connected to the main quantum detector via a transmission line and a coupling inductor 572. The value of resistor 571 may for example be 50Ω. The coupling inductor may be adjusted so that the coupling rate between the quantum detector and the microwave source 57 is substantially equal to the rate at which energy quanta from the quantum detector are lost to the output transmission line. Reflection of microwaves at the interface between the microwave source and the quantum detector is thereby minimized within the detection bandwidth.

The main bias current source may comprise a first circuit portion which comprises a voltage source in series with a resistor and a second circuit portion which comprises a capacitor and an inductor acting as an LC filter. The first circuit portion is coupled in parallel with the capacitor of the second circuit portion, and the inductor of the second circuit portion is coupled between the quantum detector and the first circuit portion.

Figure 5B:
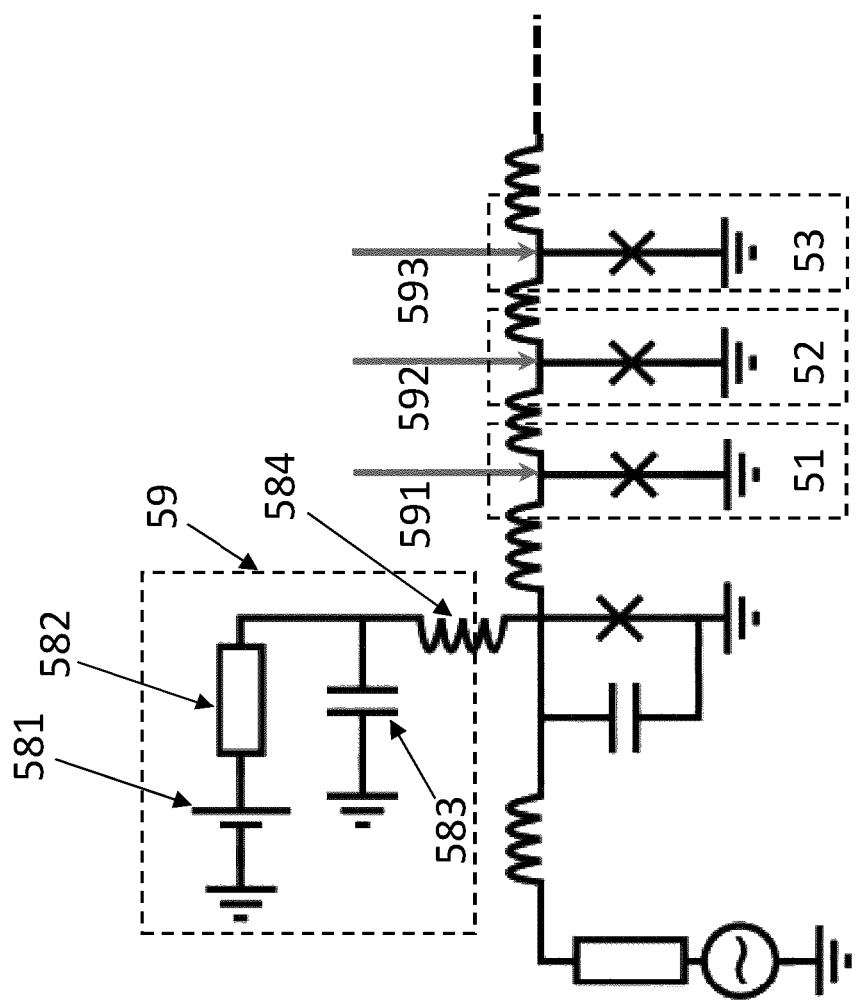
FIG. 5b illustrates a main bias current source.

FIG. 5b illustrates a main bias current source 59 with a ground-referenced voltage source 581 and a resistor 582 in the first circuit portion. A ground-referenced capacitor 583 and an inductor 584 form the second circuit portion. Compared to a standard stiff current source where the value of 582 is high compared to other resistances in the system, the benefit of using this arrangement in the main bias current source 59 is that the tilt of washboard potential effectively decreases when the main junction produces a flux-quantum to the output by an amount that can be configured using the value of resistor 582 on a time scale that can be configured using the values of the capacitor 583 and the inductor 584. This may widen the margin of operating conditions where the quantum detector does not become permanently latched to the non-zero voltage state after a detection event.

The invention claimed is:

1. A quantum detector configured to receive a microwave signal from a microwave source, wherein the quantum detector comprises a main element formed by a capacitively shunted main Josephson junction which is coupled to a main bias current source, wherein the main element is coupled to the microwave source which inputs the microwave signal to the main element, and the quantum detector further comprises a Josephson transmission line which is coupled to the main element for outputting a measurement signal, wherein the Josephson transmission line comprises at least a first set of JTL elements and a second set of JTL elements, wherein the first JTL element in the first set is formed by a capacitively shunted Josephson junction coupled inductively to the main Josephson junction, and all other JTL elements in the first and second sets are formed by a capacitively shunted Josephson junction coupled inductively to the Josephson junction of the neighbouring JTL element, wherein the first and second sets of JTL elements are ordered in the Josephson transmission line so that the first set is closest to the main element, and each JTL element in the first set is weakly damped, and the JTL elements in the second set are ordered in order of increasing damping, so that the JTL element in the second set which is closest to the first set has the weakest damping, and the JTL element in the second set which is furthest away from the first set has the strongest damping, and all other JTL elements in the second set have stronger damping than the neighboring JTL element on the side of the first set, and weaker damping than the neighboring JTL element on the opposite side.

2. The quantum detector according to claim 1, wherein the Josephson transmission line further comprises a third set of JTL elements, wherein each JTL element in the third set is strongly damped, and each JTL element in the second set is more weakly damped than any of the JTL elements in the third set.

3. The quantum detector according to claim 1, wherein the main bias current source comprises a first circuit portion which comprises a voltage source in series with a resistor and a second circuit portion which comprises a capacitor and an inductor acting as an LC filter where the first circuit portion is coupled in parallel with the capacitor of the second circuit portion, and the inductor of the second circuit portion is coupled between the quantum detector and the first circuit portion.

* * * * *